(12) United States Patent
Anna et al.

(10) Patent No.: US 11,139,414 B2
(45) Date of Patent: Oct. 5, 2021

(54) ALINGAN-BASED SUPERLUMINESCENT DIODE

(71) Applicants: TopGaN Sp. z o.o., Warsaw (PL); Instytut Wysokich Cisnien Polskiej Akademii Nauk, Warsaw (PL)

(72) Inventors: Kafar Anna, Gdynia (PL); Szymon Stanczyk, Gdynia (PL); Anna Nowakowska-Siwinska, Warsaw (PL); Marcin Sarzynski, Warsaw (PL); Tadeusz Suski, Nowy Prazmów (PL); Piotr Perlin, Warsaw (PL)

(73) Assignees: TOPGAN SP. Z O.O., Warsaw (PL); Instytut Wysokich Cisnien Polskiej Akademii Nauk

( * ) Notice: Subject to any disclaimer, the term of this patent is extended or adjusted under 35 U.S.C. 154(b) by 840 days.

(21) Appl. No.: 15/762,966

(22) PCT Filed: Sep. 23, 2016

(86) PCT No.: PCT/PL2016/050044
§ 371 (c)(1),
(2) Date: Mar. 23, 2018

(87) PCT Pub. No.: WO2017/052397
PCT Pub. Date: Mar. 30, 2017

(65) Prior Publication Data
US 2020/0259043 A1    Aug. 13, 2020

(30) Foreign Application Priority Data

Sep. 23, 2015 (PL) .......................... 414077

(51) Int. Cl.
*H01L 33/00* (2010.01)
*H01L 33/20* (2010.01)
(Continued)

(52) U.S. Cl.
CPC .......... *H01L 33/0045* (2013.01); *H01L 33/06* (2013.01); *H01L 33/16* (2013.01);
(Continued)

(58) Field of Classification Search
CPC ... H01S 5/34373; H01S 5/3415; H01L 33/20; H01L 33/16; H01L 33/0045; H01L 33/06
See application file for complete search history.

(56) References Cited

U.S. PATENT DOCUMENTS 6,838,693 B2  1/2005  Kozaki
7,045,812 B2  5/2006  Lin
(Continued)

FOREIGN PATENT DOCUMENTS

EP    0 318 947 A2    6/1989
EP    0318947 A2      6/1989
(Continued)

OTHER PUBLICATIONS

Ching-Fuh Lin, and Chaur-Shiuann Juang, "Superluminescent diodes with bent waveguide," IEEE Photonics Technology Letters, Feb. 1996, pp. 206-208, vol. 8, No. 2, IEEE Service Cetner, Piscataway, NJ. US, doi: 10.1109/68.484242.

(Continued)

*Primary Examiner* — Savitri Mulpuri
(74) *Attorney, Agent, or Firm* — Cherskov Flaynik & Gurda, LLC (57) ABSTRACT

The invention relates to an AlInGaN alloy based superluminescent diode, comprising a gallium nitride bulk substrate, a lower cladding layer with n-type electrical conductivity. Further it includes a lower light-guiding layer with n-type electrical conductivity, a light emitting layer, an electron blocking layer with p-type electrical conductivity, an upper light-guiding layer, an upper cladding layer with p-type electrical conductivity, and a subcontact layer with (Continued)

p-type electrical conductivity. The gallium nitride bulk substrate has a spatially varying surface misorientation in the relation to the crystallographic plane M in range of 0° to 10°.

7 Claims, 9 Drawing Sheets

(51) Int. Cl.
    *H01S 5/34* (2006.01)
    *H01L 33/06* (2010.01)
    *H01L 33/16* (2010.01)
    *H01S 5/343* (2006.01)

(52) U.S. Cl.
    CPC ............ *H01L 33/20* (2013.01); *H01S 5/3415* (2013.01); *H01S 5/34373* (2013.01)

(56) References Cited

U.S. PATENT DOCUMENTS

| | | |
|---|---|---|
| 9,020,003 B1 | 4/2015 | McLaurin et al. |
| 2002/0024052 A1 | 2/2002 | Liang et al. |
| 2010/0219416 A1 | 9/2010 | Farrel et al. |
| 2011/0243172 A1 | 10/2011 | Lin et al. |
| 2013/0292723 A1 | 11/2013 | Ohno |
| 2015/0123138 A1* | 5/2015 | Kizilyalli .......... H01L 21/02634 257/76 |

FOREIGN PATENT DOCUMENTS

| | | |
|---|---|---|
| EP | 1583190 B1 | 10/2005 |
| EP | 1 583 190 B1 | 12/2008 |
| JP | 2011003661 A | 6/2011 |
| PL | 221156 B1 | 2/2016 |
| WO | 2011124997 A1 | 10/2011 |
| WO | 2015187046 A1 | 12/2015 |

OTHER PUBLICATIONS

European Patent Office Communication Pursuant to Article 94(3) EPC, dated Apr. 20, 2020.

L.A. Coldren, S. W. Corzine, "Diode Lasers and Photonic Integrated Circuits," Opt. Eng. 36(2), 616-617 (1997).

Nakamura, S. (1999), "InGaN/GaN/AlGaN-based laser diodes grown on epitaxially laterally overgrown GaN," Journal of Materials Research, 14(7), 2716-2731. doi:10.1557/JMR.1999.0365.

Marcin Sarzyski et al., "Lateral Control of Indium Content and Wavelength of III-Nitride Diode Lasers by Means of GaN Substrate Patterning," 2012 Appl. Phys. Express 5 021001.

G. A. Alphonse and M. Toda, "Mode coupling in angled facet semiconductor optical amplifiers and superluminescent diodes," J. Lightwave Technol. 10, 215 (1992).

Ching-Fuh Lin, "Superluminescent Diodes with Bent Waveguide," IEEE Photonics Technology Letters, IEEE Service Center, Piscataway, NJ, US, vol. 8, No. 2, Feb. 1, 1996 (Feb. 1, 1996).

* cited by examiner

ALINGAN-BASED SUPERLUMINESCENT DIODE

PRIORITY CLAIM

The instant application claims priority as a U.S. Nationalization of PCT case PCT/PL2016/050044, with an international filing date of Sep. 23, 2016, which in turn claimed priority to a Polish application P.414077 filed on Sep. 23, 2015, the contents of each of which are incorporated herein by reference.

BACKGROUND OF THE INVENTION

Technical Field

The present invention relates to a superluminescent diode produced on the basis of AlInGaN alloy with a spatially varying indium content active layer, characterised by a broadened emission spectrum, having application in optoelectronics, photonics and optical fibre systems, particularly as a source of visible light.

Background

Superluminescent diodes are usually manufactured as devices with separate confinement of current and light carriers. Such structure is referred to as Separate Confinement Heterostructure. On a monocrystalline substrate, e.g. of GaAs, InP or GaN, a sequence of thin semiconductor layers are created, described, among others, in the publication by L. A. Coldren, S. W. Corzine, "Diode Lasers and Photonic Integrated Circuits" Opt. Eng. 36(2), 616-617 (1997). The active layer of such devices are quantum wells confined within quantum barriers, and the light is guided in an optical waveguide made of layers with high refractive index surrounding the active part of the laser, confined by layers with low refractive index. Further on in the present description, the term "diode light-guide" shall relate to a section of the quantum wells area and light-guiding layers surrounding them, where the light is guided in the device. Lateral confinement for the carriers and light can be obtained in any way known in the art (e.g. by means of the structures: index guiding, gain guiding, mesa, buried ridge) without any influence on the generality of the reasoning below. The lateral confinement results in obtaining a high density of light and carriers in the active area. The geometry of the device and the additional antireflective layers prevent light oscillation in the device.

In case of group III metal nitrides based superluminescent diodes, emitting light within the range of 390-550 nm, the layers mentioned above are executed in a characteristic way described, among others, in publication by S. Nakamura, "InGaN/GaN/AlGaN-based laser diodes grown on epitaxially laterally overgrown GaN," J. Mater. Res. 14, 2716 (1999) and in U.S. Pat. No. 6,838,693 B2 patent description. Crystalline gallium nitride with thickness of 50 to 200 μm is used as the substrate. Mechano-chemical polishing is used to prepare the surface of the gallium nitride in order to obtain an atomically smooth surface for the epitaxial growth. The atomic steps are obtained by polishing the surface at a chosen angle in relation to the crystallographic planes of the crystal. Their density affects the amount of indium incorporated in the InGaN layers in the epitaxial growth later on (the mechanism described, among others, in the publication Sarzynski et al., "Lateral Control of Indium Content and Wavelength of III—Nitride Diode Lasers by Means of GaN Substrate Patterning," Appl. Phys. Express 5, 021001 (2012)).

SUMMARY OF THE INVENTION

The device can be grown by the metal-organic chemical vapour deposition as well as by the method of molecular beam epitaxy. The cladding layers are made of gallium-aluminium nitride $Al_xGa_{1-x}N$, wherein x is within the range of 0.05 to 0.12, with the layer thickness of 0.5 μm to 5 μm. The lower cladding layer is silicon doped at the level of $5 \times 10^{18}$ $cm^{-3}$. The upper cladding layer is usually magnesium doped at the level of $5 \times 10^{19}$ $cm^{-3}$ to $1 \times 10^{20}$ $cm^{-3}$. The light-guiding layers are usually made of gallium nitride, with thickness of 0.05 μm to 0.15 μm. The lower light-guiding layer can be silicon doped, while the upper light-guiding layer can be magnesium doped. Moreover, both light-guiding layers can be undoped. For diodes with emission within 390-550 nm, the electron blocking layers are made of $Al_xGa_{1-x}N$, wherein x is in the range of 0 to 0.2. The quantum well forming layer is made of $In_xGa_{1-x}N$, wherein x is in the range of 0 to 0.3, with layer thickness of 2 nm to 10 nm.

Light guiding is obtained by etching the selected regions of the epitaxial structure, wherein the etch depth is not greater than the interface between the upper cladding and the upper light guide layer. The etch contour is selected in such a way that the remaining region forms a waveguide that is not perpendicular to the light guide output facet (crystal cleavage planes). From the top side of the device, electric power is supplied exclusively through the upper surface of the obtained mesa (ridge).

The superluminescent diode waveguide can have the shape of a tilted or bend strip. The waveguide facet reflectivity is determined by the refractive indices of the light guide, the neighbouring area in the layers plane, and the device environment (air or gas used in hermetic assembly) and the value of the terminal angle between the waveguide axis and the normal to the output facet surface. These relations are described in the publication by G. A. Alphonse and M. Toda, "Mode coupling in angled facet semiconductor optical amplifiers and superluminescent diodes," J. Lightwave Technol. 10, 215 (1992). The geometry of the waveguide is optimized for obtaining the smallest reflectivity of the waveguide output facet window.

An ideal superluminescent diode has one or both of the waveguide windows with the reflectivity coefficient equal to 0, thus the light guided in the waveguide cannot be reflected back. However, in reality, a part of light is always reflected back and can oscillate between the windows. This part of light is observed in the emission spectrum of the device as modulations being the cavity modes of the waveguide. As the electric current supplying the superluminescent diode increases, it causes an increase in the stimulated emission part in light generation, which leads to a narrowing in the emission spectrum and an enlargement of the modulation depth. However, applications such as optical coherence tomography or optical fibre gyroscopes require the widest and smoothest emission spectrum possible. This issue can be resolved by applying quantum wells with various emitted wavelengths (as disclosed in U.S. Pat. No. 7,045,812 B2 patent), but such method entails a strong absorption of the light generated in a well with a higher band gap by a well with a lower band gap.

From the European patent EP1583190B1, a semiconductor laser is known, comprising a nitride semiconductor substrate, a nitride semiconductor layer with first type electrical conductivity, an active layer, and a nitride semiconductor layer with second type electrical conductivity, on the surface of which a "ridge" type structure was created. In the cited solution the main plane of the semiconductor substrate is tilted in relation to a said direction, i.e. tilted at an angle $\theta_a$ in the direction perpendicular to the plane M (1-100) and angle $\theta_b$ in the direction parallel to the plane M (1-100). This allows obtaining a uniform distribution of the semiconductor layer in the structure of the device, with respect to the crystalline properties and indium content in the active layer. Using a tilted substrate allowed obtaining a flat crystal growth due to the irregularities on the atomic surface, and thus has improved the extraction properties of the created nitride semiconductor laser.

Superluminescent diodes created in an analogical manner have good optoelectric parameters, however their emission spectrum is intensively narrowing with the increase of supplied electric current, with simultaneous increase of the modulation depth in the emission spectrum.

BRIEF DESCRIPTION OF THE DRAWINGS

The invention together with the above and other objects and advantages will be best understood from the following detailed description of the preferred embodiment of the invention shown in the accompanying drawings, wherein.

DETAILED DESCRIPTION

The technical problem faced by the present invention is to propose such a AlInGaN based superluminescent diode structure that would be characterised by improved optical parameters, in particular a wider emission spectrum and reduced modulation depth in the spectrum. Simultaneously, there is a desire for a problem solution that would not involve any significant change in the present manufacturing process, thereby not causing a significant increase of the cost of a single device. Moreover, an ability to modify the shape of the emission spectrum of such a superluminescent diode is desired. Unexpectedly, the technical problems mentioned above have been solved by the present invention.

The present invention relates to AlInGaN alloy based superluminescent diode, comprising a gallium nitride bulk substrate, a lower cladding layer with n-type electrical conductivity, a lower light-guiding layer with n-type electrical conductivity, a light emitting layer, an electron blocking layer with p-type electrical conductivity, an upper light-guiding layer, an upper cladding layer with p-type electrical conductivity, and a sub-contact layer with p-type electrical conductivity, characterised in that the gallium nitride bulk substrate has a spatially varying surface misorientation in the direction perpendicular to the crystallographic plane M in range of 0° to 10°. In a preferred embodiment of the invention the substrate misorientation is increasing from the back light guide window towards the front light guide window. In another preferred embodiment of the invention the increase of the substrate misorientation in the direction of the front light guide window is continuous, linear, approximately linear or non-linear in relation to the light guide axis. In another preferred embodiment of the invention the substrate misorientation, expressed in terms of the angle θ in relation to the direction parallel to the crystallographic plane C and perpendicular to the crystallographic plane M, has an approximately linear character satisfying the relation:

$$\theta = \arctg\left(\frac{h}{wl}y\right), \quad (W3)$$

where y is the coordinate in the direction parallel to the crystallographic plane C and perpendicular to the crystallographic plane M, w is a parameter specifying the chip width of the manufactured superluminescent diode, l is a parameter specifying the chip length of the manufactured superluminescent diode, whereas h is the maximum depth at which the substrate is formed. Equally preferably, the substrate misorientation, expressed in terms of the angle θ in relation to the direction parallel do the crystallographic plane C and perpendicular to the crystallographic plane M, has a non-linear character satisfying the relation:

$$\theta = \frac{\theta_{min} - \theta_{max}}{\exp\left(\frac{y-l}{b}\right) + 1} + \theta_{max}, \quad (W4)$$

where y is the coordinate in the direction parallel to the crystallographic plane C and perpendicular to the crystallographic plane M, $\theta_{max}$ is the maximum misorientation angle in the direction perpendicular to the y direction equal to arctg(h/w), $\theta_{min}$ is the minimum misorientation angle in the direction perpendicular to the y direction, b is a parameter affecting the profile shape, l is a parameter specifying the chip length of the manufactured superluminescent diode. More preferably, the substrate misorientation, expressed in terms of the angle θ in relation to the direction parallel to the crystallographic plane C and perpendicular to the crystallographic plane M, has a non-linear character satisfying the relation:

$$\theta = \left(\frac{a_1}{\exp\left(\frac{y-ld_1}{b_1}\right)} + \frac{a_2}{\exp\left(\frac{y-ld_2}{b_2}\right)}\right)\left(\frac{\theta_{min} - \theta_{max}}{a_1 + a_2}\right) + \theta_{max}, \quad (W6)$$

where y is the coordinate in the direction parallel to the crystallographic plane C and perpendicular to the crystallographic plane M, $\theta_{max}$ is the maximum misorientation angle in the direction perpendicular to the y direction equal to arctg(h/w), $\theta_{min}$ is the minimum misorientation angle in the direction perpendicular to the y direction, $a_1$ and $a_2$ are parameters affecting the relative heights of the first and second level, $b_1$ and $b_2$ are parameters affecting the profile shape of the first and second level, $d_1$ and $d_2$ are parameters affecting the location of the first and second level, l is a parameter specifying the chip length of the manufactured superluminescent diode. In a preferred embodiment of the invention the front light guide window is covered with a dielectric layer with the reflection coefficient lower than 5%. In another preferred embodiment of the invention the back light guide window is covered with a dielectric layer with the reflection coefficient higher than 80%. In another preferred embodiment of the invention the subcontact layer is doped with acceptors in concentration higher than $10^{20}$ cm$^{-3}$.

The goal of substrate forming is obtaining an increase of substrate misorientation along the superluminescent diode light guide, from the back to the front light guide window. The direction of the misorientation vector can be perpendicular, as well as parallel, to the light guide axis. It is also possible to perform the substrate forming such that the misorientation direction is arbitrary in relation to the waveguide axis and varying in different regions along the waveguide.

The invention enables an improvement of the optical properties of the superluminescent diode by widening the emission spectrum and reducing modulation in the spectrum. The regions with different substrate misorientation result in different indium content in the light generating active layer, and therefore a different central light emission wavelength. As a result, the light leaving the front light guide window has an emission spectrum that is a sum of the emission spectra of individual light guide fragments reduced by the waveguide optical losses. Applying an increase of substrate misorientation along the light guide in the direction of the exit window entails a decrease of indium content, and therefore an increase of the active region band gap width. Such order allows reducing the reabsorption of light in the system.

The invention also enables a detailed modification of the shape of the superluminescent diode emission spectrum by applying a smooth, non-linear variation of the misorientation value along the diode light guide. Increasing the part of a particular misorientation in the total shape of the substrate allows increasing the part of the emission spectrum associated with the corresponding indium content in the active region. By means of a proper design of the misorientation profile along the light guide it is possible to, among others, increase the part of the highest and lowest wavelengths in the final emission spectrum, which leads to a significant widening of the spectrum. It is also possible to obtain a shape of the emission spectrum that is approximately rectangular. The invention also allows creating a light guide with reduced losses relative to the light guide formed on a substrate with a step change of misorientation (flat regions with uniform misorientation), due to the lack of losses on interfaces between the regions with different misorientation, which are folds of the light guide. The invention can also be applied as a light source of a tunable external cavity laser. In such case, the invention will enable a significant widening of the laser tuning wavelength range, due to a wide emission spectrum. An advantage of the invention is also its compatibility with the conventional process of device manufacturing and assembly. The only thing required is a proper preparation of the gallium nitride bulk substrate. The further technological steps do not require changes, thus the change of the manufacturing cost is negligible and the invention does not require a separate production line.

Figure 1:
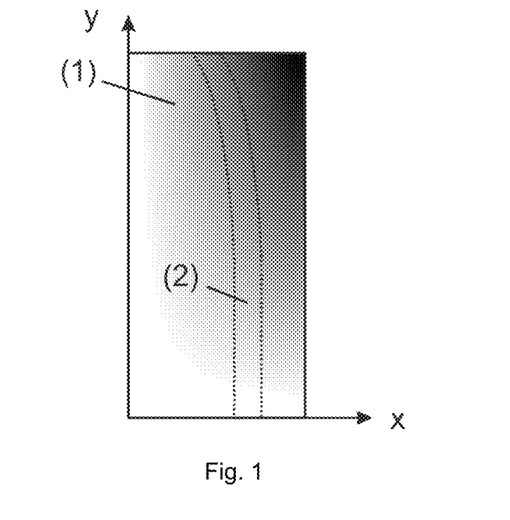
FIG. 1 shows a diagram of irradiation of the photoresist on semiconductor substrate according to the first embodiment of the invention.
Figure 2:
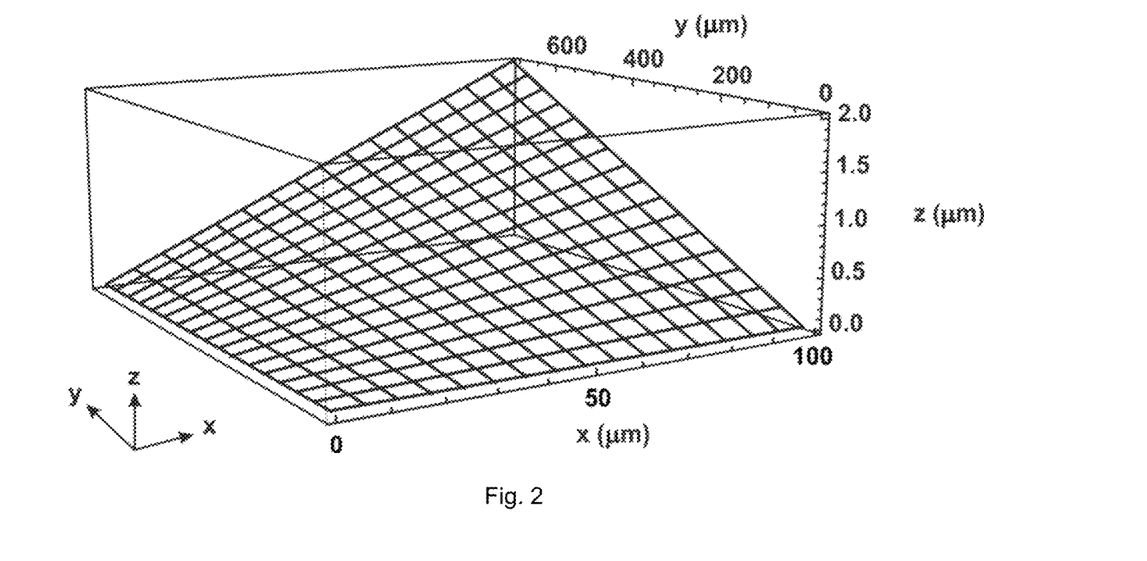
FIG. 2 is a plot presenting the thickness distribution of substrate of FIG. 1.
Figure 3:
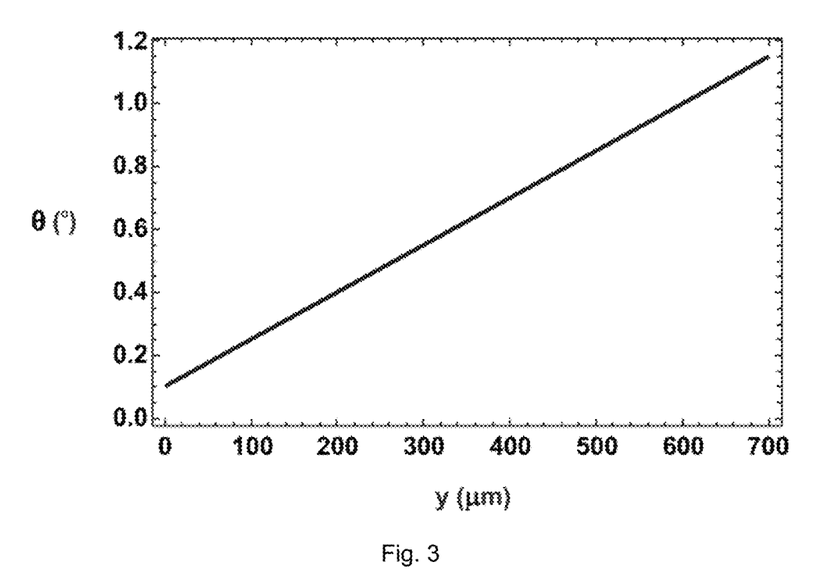
FIG. 3 shows the profile of misorientation variation along the superluminescent diode light guide for the shape of the substrate presented in FIG. 2.
Figure 4:
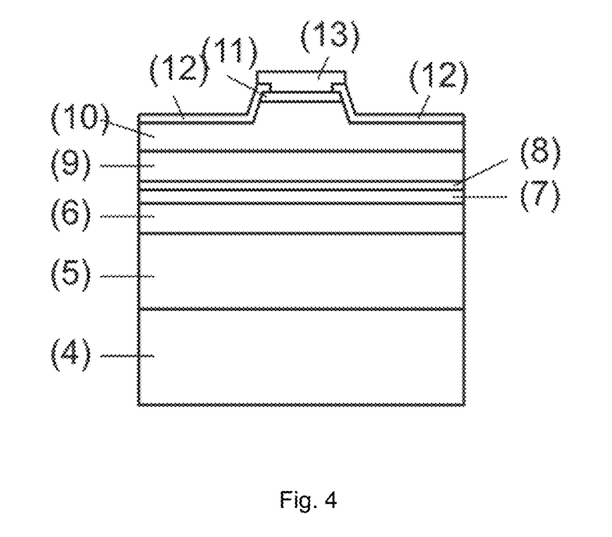
FIG. 4 is a cross section of one embodiment of the superluminescent diode of the present invention.
Figure 5A:
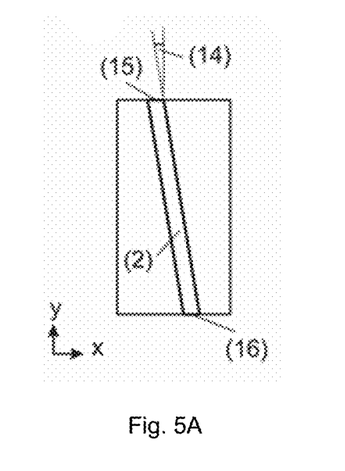
FIGS. 5A and 5B show exemplary shapes of the light guides applied in superluminescent diodes in a top view, pursuant to one embodiment of the invention.
Figure 5B:
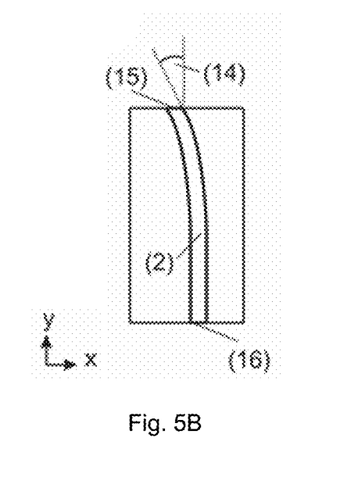
Figure 6A:
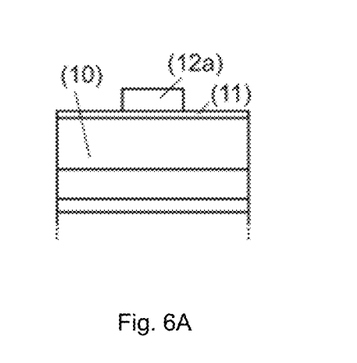
FIGS. 6A-E shows the subsequent technological steps of manufacturing the mesa of the superluminescent diode of one embodiment of the present invention.
Figure 6B:
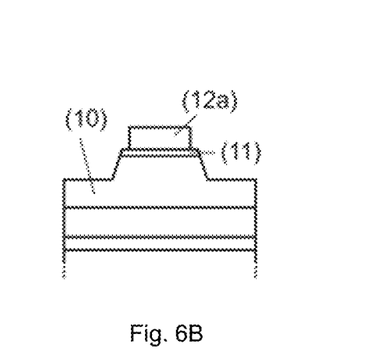
Figure 6C:
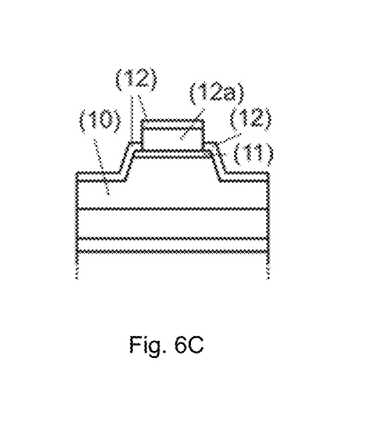
Figure 6D:
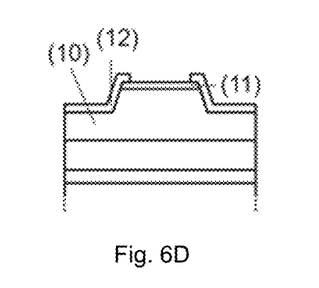
Figure 6E:
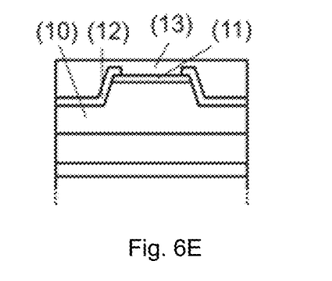
Figure 7A:
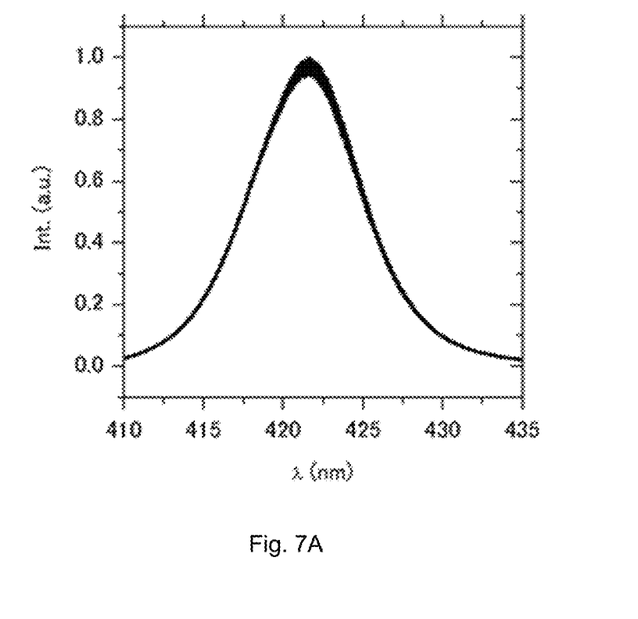
FIG. 7A shows the emission spectrum of the superluminescent diode according to the first embodiment of the present invention.
Figure 7B:
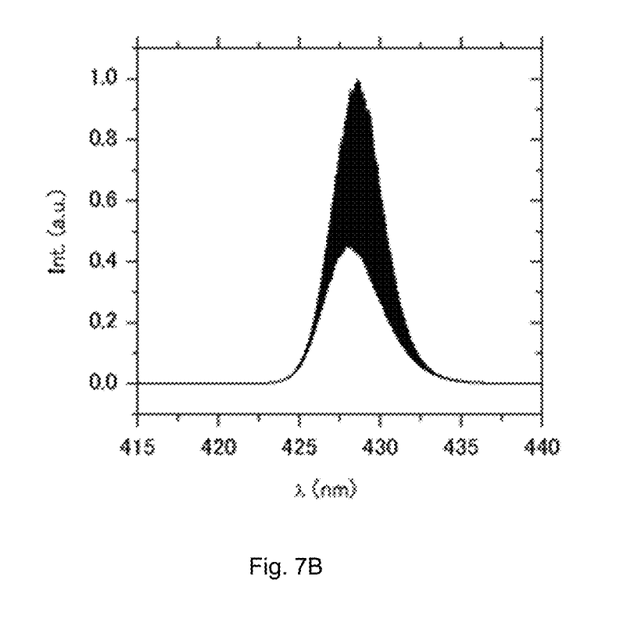
FIG. 7B shows the emission spectrum of a reference device.
Figure 8:
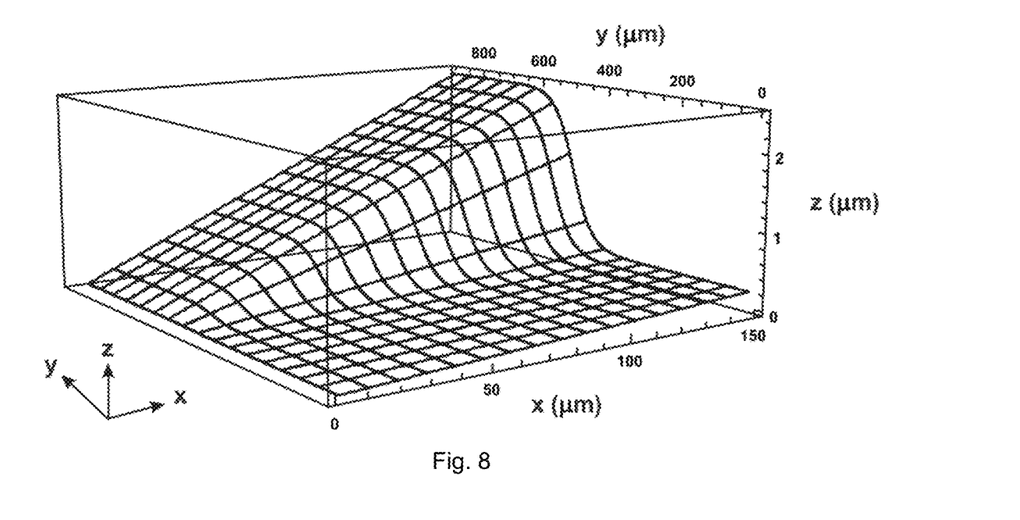
FIG. 8 is a plot presenting the thickness distribution of substrate according to the second embodiment of the present invention.
Figure 9:
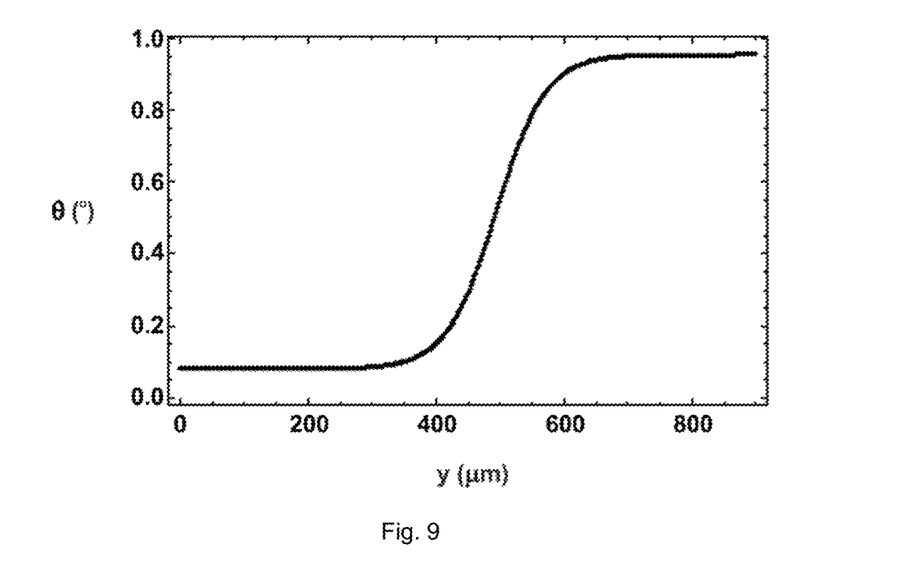
FIG. 9 shows the profile of misorientation variation in the y direction of the superluminescent diode for the shape of the substrate presented in FIG. 8.
Figure 10:
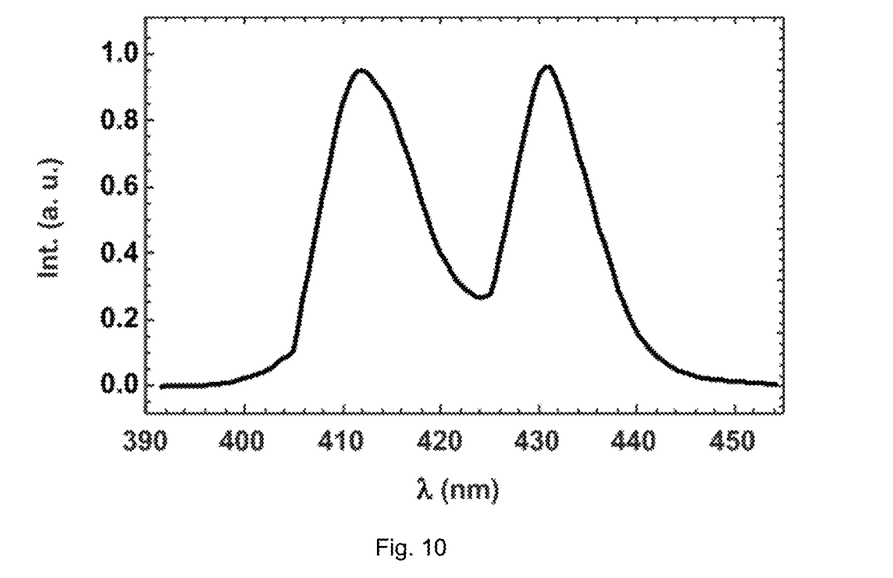
FIG. 10 shows the emission spectrum of the superluminescent diode according to the second embodiment of the invention.
Figure 11:
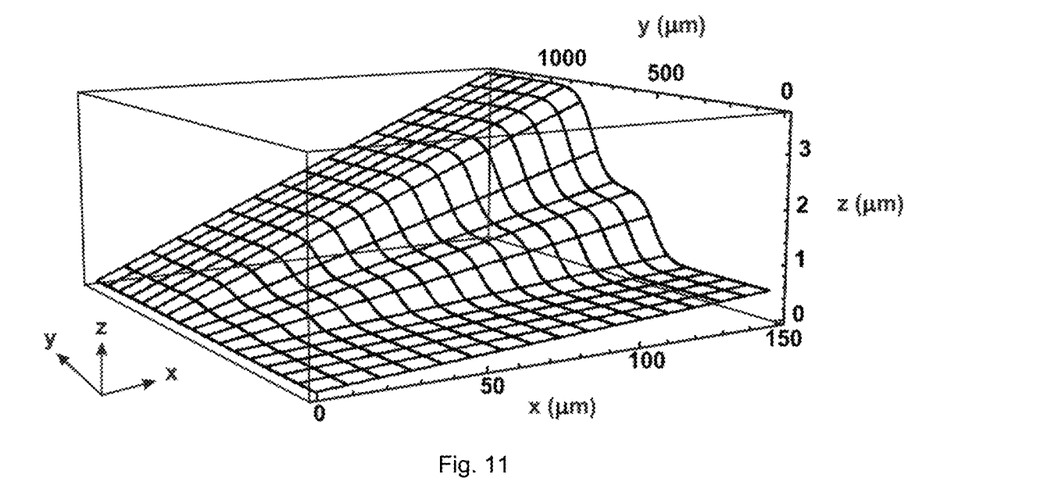
FIG. 11 is a plot presenting the thickness distribution of substrate according to the third embodiment of the present invention.
Figure 12:
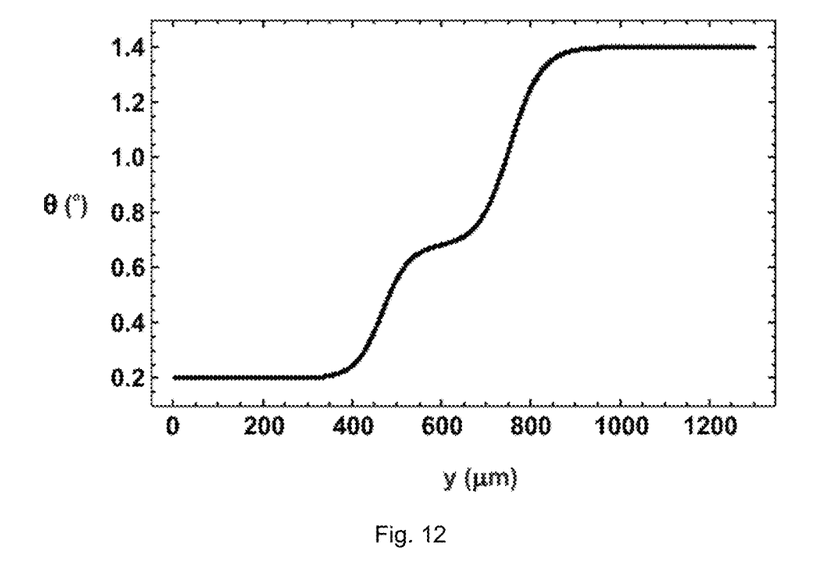
FIG. 12 shows the profile of misorientation variation in the y direction of the superluminescent diode for the shape of the substrate presented in FIG. 11.
Figure 13:
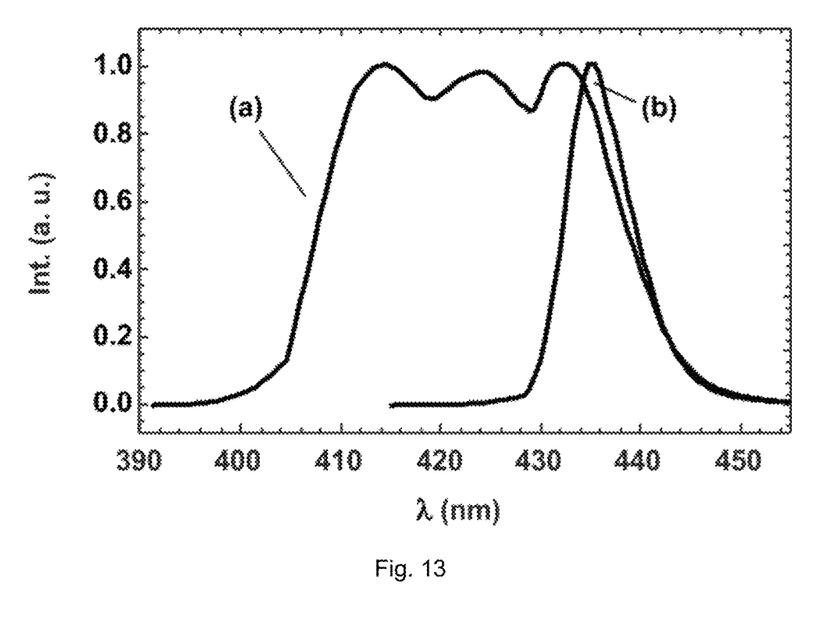
FIG. 13 shows the emission spectrum of the superluminescent diode according to the third embodiment of the invention.

Exemplary embodiments of the invention have been presented in the drawings, wherein FIG. 1 shows a diagram of irradiation of the photoresist on semiconductor substrate according to the first embodiment of the invention, FIG. 2 is a plot presenting the thickness distribution of substrate of FIG. 1, FIG. 3 shows the profile of misorientation variation along the superluminescent diode light guide for the shape of the substrate presented in FIG. 2, FIG. 4 is a cross section of the superluminescent diode of the present invention, FIGS. 5a and 5b show exemplary shapes of the light guides applied in superluminescent diodes in a top view, FIG. 6 shows the subsequent technological steps of manufacturing the mesa of the superluminescent diode of the present invention, FIG. 7 shows the emission spectrum of the superluminescent diode (a) according to the first embodiment of the present invention, and (b) the reference device, FIG. 8 is a plot presenting the thickness distribution of substrate according to the second embodiment of the present invention, FIG. 9 shows the profile of misorientation variation in the y direction of the superluminescent diode for the shape of the substrate presented in FIG. 8, FIG. 10 shows the emission spectrum of the superluminescent diode according to the second embodiment of the invention, FIG. 11 is a plot presenting the thickness distribution of substrate according to the third embodiment of the present invention, FIG. 12 shows the profile of misorientation variation in the y direction of the superluminescent diode for the shape of the substrate presented in FIG. 11, FIG. 13 shows the emission spectrum of the superluminescent diode according to the third embodiment of the invention.

Example 1

The first embodiment of the present invention is a superluminescent diode with a widened emission spectrum and a linear variation of the misorientation angle in the y direction, created on a uniform $GaO_xN_{1-x}$ substrate obtained in high-pressure growth. In the first step of manufacturing of such a superluminescent diode a $GaO_{0.0005}N_{0.9995}$ substrate was created by means of growing from a gallium solution of nitrogen under the pressure of 1000 MPa and at temperature of 1500° C. The obtained crystal was cut and polished so as to obtain a parallel-flat plate with typical thickness of 200 µm. After appropriate mechano-chemical polishing, the crystal surface with gallium polarity had an atomic smoothness, demonstrated by the atomic steps in an Atomic Force Microscope image. The crystal surface was disoriented by 0.1° in relation to the direction of the crystallographic axis c of the GaN hexagonal (wurtzite) structure.

Next, a 2 µm thick positive photoresist 1 layer was deposited on the substrate. The layer was irradiated by means of a "laser writer" apparatus with a 405 nm wavelength emission laser as the light source. The irradiation was performed by scanning the photoresist 1 surface by a light beam, wherein the light intensity was changing according to the design of the substrate 4 forming. This example uses the irradiation pattern shown in FIG. 1, enabling to create on the substrate 4, in the region of one superluminescent diode, a shape with the surface described by the equation W1, $$z = \frac{h}{wl}xy, \quad \text{(W1)}$$

where x is a coordinate in the direction parallel to the crystallographic plane C of the crystal and simultaneously parallel to the crystallographic plane M, y is a coordinate in the direction parallel to the crystallographic plane C and perpendicular to the crystallographic plane M, z is a coordinate in the direction perpendicular to the crystallographic plane C and parallel to the crystallographic plane M, w is a parameter specifying the chip width of the manufactured superluminescent diode, l is a parameter specifying the chip length of the manufactured superluminescent diode, whereas h is the maximum depth at which the substrate is formed. An example of such surface is presented in FIG. 1. In this embodiment the substrate surface profile in the x direction is linear and described by the equation:

$$z = \frac{hy_a}{wl}x, \quad \text{(W2)}$$

where $y_a$ is a parameter specifying the value of y coordinate for which the profile was made. In such case the dependence of the misorientation angle θ on the y coordinate is an approximately linear described by the equation:

$$\theta = \arctg\left(\frac{h}{wl}y\right). \quad \text{(W3)}$$

In the present embodiment, the following parameters were applied: h=2 µm, w=100 µm, and l=700 µm. The brightness change in FIG. 1 corresponded to the change of laser light intensity, and thus the change of the photoresist 1 layer thickness after developing. The dotted line 2 specifies the future placement of the superluminescent diode light guide. Substrate 4 with formed photoresist 1 was subjected to the reactive ions dry etching method using argon-chlorine plasma. The etching time was 17.5 minutes. The process allowed the photoresist 1 structure to be transferred to the gallium nitride bulk substrate 4. The obtained plane is shown in FIG. 2, having a varying misorientation angle in the y direction, shown in FIG. 3.

The formed substrate is indicated by number 4 on the diagram of FIG. 4. Next, the substrate 4 was placed in a MOVPE reactor, where 800 nm thick $Ga_{0.92}Al_{0.08}N$ layer 5, doped with silicon to the $5 \times 10^{18}$ cm$^{-3}$ level, was created, at the temperature of about 1050° C. Then, at the same temperature, a 100 nm thick layer of undoped GaN was created, acting as the lower waveguide 6. After lowering the temperature to 820° C. a light emitting region 7 was created, as an $In_{0.1}Ga_{0.9}N/In_{0.02}Ga_{0.98}N$ multiple quantum well, where the number of quantum wells was three. Then, after increasing the reactor temperature to 1050° C., a $Al_{0.2}Ga_{0.98}N$:Mg layer 8 was created, for blocking the escape of the electrons. Afterwards, an undoped GaN layer was created, acting as the upper light guide 9. The next layer was the 430 nm thick $Al_{0.05}Ga_{0.95}N$ upper cladding layer 10. The structure's growth was finished by a thin GaN:Mg subcontact layer 11 with magnesium concentration higher than $10^{20}$ cm$^{-3}$. After completion of the structure growth the reactor was cooled in nitrogen atmosphere.

Next, photolithography defining the mesa shape as a curved strip was performed (FIG. 5b). The ending curvature of the light guide 14 in relation to the crystal cleavage planes (the future exit windows of the light guide 15) was 6°.

FIG. 6 schematically illustrates the process of creating the mesa and the upper contact. The first technological step was depositing a 2 µm thick photoresist layer 12a on the area of the designed light guide. Afterwards, a reactive ions dry etching of the crystal to the depth of 500 nm was performed. In this way, a mesa in the cladding layer 10 and the subcontact layer 11 was created, which is shown in the diagram of FIG. 6b. Next, a 200 nm thick layer of isolating material $SiO_2$ 12 was deposited on the whole crystal, shown in FIG. 6c. Due to the high thickness of the photoresist, its side edges are not fully covered by the isolator 12. Performing the wet etching enables uncovering the mesa's ridge (FIG. 6d), whilst leaving the isolator 12 on the sides of the mesa and in the area around the mesa. The next technological step was depositing the upper 13 and lower contacts (on the substrate 4) made of a nickel-gold alloy with thickness of 100 nm.

Then, the crystal was divided along the crystal cleavage planes forming strips containing many devices, wherein the division took place along the designed locations of the light guide windows, i.e. the front window 15 and back window 16 of individual device. The first step enabling the division was scratching the crystal along the intended division lines. Next, due to the mechanical stresses, the crystal was broken along the cleavage planes.

The next step was dividing the strips on the individual devices performed in an analogical way to the division on the strips, except not along the cleavage planes, but perpendicularly to them.

The last step was the assembly of the devices in a standard TO-56 housing. A thin layer of SnPb solder was placed on the housing socket. The device was placed on said layer with the substrate 4 side towards the solder. The device was connected with the support by the annealing process at temperature of 200° C. Afterwards, an electrical contact with the upper contact 13 material was made, using the ball-bonding technique. Then, the housing of the diode was hermetically closed, using protective atmosphere preventing water condensation inside the housing. By applying the formed substrate the emission spectrum was widened and the modulation depth in the superluminescent diode emission spectrum was reduced (FIG. 7a) relative to the reference device with the same geometry, created in the same process, except on a substrate fragment with constant misorientation (FIG. 7b).

Example 2

The second embodiment of the present invention is a superluminescent diode with a widened emission spectrum and a linear variation of the misorientation angle in the y direction, described by the equation W4, created on a uniform $GaO_xN_{1-x}$ substrate obtained in high-pressure growth. In the first step a $GaO_{0.0005}N_{0.9995}$ substrate was created by means of growing from a gallium solution of nitrogen under the pressure of 1000 MPa and at temperature of 1500° C. The obtained crystal was cut and polished so as to obtain a parallel-flat plate with typical thickness of 250 µm. After appropriate mechano-chemical polishing, the crystal surface with gallium polarity had an atomic smoothness, demonstrated by the atomic steps in an Atomic Force Microscope image. The crystal surface was disoriented by 0.1° in relation to the direction of the crystallographic axis c of the GaN hexagonal (wurtzite) structure. Next, a 3 µm thick positive photoresist 1 layer was deposited on the substrate. The layer was irradiated by means of a laser writer apparatus with a 405 nm wavelength emission laser as the light source. The irradiation was performed by scanning the photoresist 1 surface by a light beam, wherein the light intensity was changing according to the design of the substrate 4 forming. This example uses the irradiation pattern enabling to create on the substrate 4, in the region of one superluminescent diode, a misorientation angle θ in the y direction described by the equation W4:

$$\theta = \frac{\theta_{min} - \theta_{max}}{\exp\left(\frac{y-l}{b}\right) + 1} + \theta_{max}, \quad (W4)$$

where $\theta_{max}$ is the maximum misorientation angle in the direction perpendicular to the y direction equal to arctg(h/w), $\theta_{min}$ is the minimum misorientation angle in the direction perpendicular to the y direction, b is a parameter affecting the profile shape. In this embodiment, the shape of the substrate surface can be described by the equation:

$$z = xtg\left(\frac{\theta_{min} - \theta_{max}}{\exp\left(\frac{y-l}{b}\right) + 1} + \theta_{max}\right) \quad (W5)$$

In the presented embodiment, the following parameters were applied: h=2.5 µm, w=150 µm, l=900 µm, b=30, $\theta_{max}$=0.95, and $\theta_{min}$=0.1.

Substrate 4 with formed photoresist 1 was subjected to the reactive ions dry etching method using argon-chlorine plasma. The etching time was 17.5 minutes. The process allowed the photoresist 1 structure to be transferred to the gallium nitride bulk substrate 4. The obtained plane, in a form of wide, approximately flat areas, is shown in FIG. 8, having a varying misorientation angle in the y direction, shown in FIG. 9.

Next, the substrate 4 was placed in a MOVPE reactor, where 800 nm thick $Ga_{0.92}Al_{0.08}N$ layer 5, doped with silicon to the $5\times10^{18}$ $cm^{-3}$ level, was created, at the temperature of about 1050° C. Then, at the same temperature, a 100 nm thick layer of undoped GaN was created, acting as the lower waveguide 6. After lowering the temperature to 820° C. a light emitting region 7 was created, as an $In_{0.1}Ga_{0.9}N/In_{0.02}Ga_{0.98}N$ multiple quantum well, where the number of quantum wells was three. Then, after increasing the reactor temperature to 1050° C. a $Al_{0.2}Ga_{0.98}N$:Mg layer 8 was created, for blocking the escape of the electrons. Afterwards, an undoped GaN layer was created, acting as the upper light guide 9. The next layer was the 430 nm thick $Al_{0.05}Ga_{0.95}N$ upper cladding layer 10. The structure's growth was finished by a thin GaN:Mg subcontact layer 11 with magnesium concentration higher than $10^{20}$ $cm^{-3}$. After completion of the structure growth the reactor was cooled in nitrogen atmosphere.

Next, photolithography defining the mesa shape as a curved strip was performed (FIG. 5b). The ending curvature of the light guide 14 in relation to the crystal cleavage planes (the future exit windows of the light guide 15) was 6°.

The process of creating the mesa and the upper contact, as well as division of the crystal on strips was carried in a way analogical to that described in the example 1. Then, a dielectric $SiO_2$ layer was deposited on the edge of the chip strip, on the side of the front light guide window 15, the layer having a thickness such that its reflectivity coefficient was equal to 0.001. The layer allowed the additional reducing of the reflectivity coefficient of the front light guide widow 15. In the next step the division of the strip on chips was performed, as well as their assembly in a manner analogical to that described in the example 1.

Due to applying the substrate with a surface described by equation W5, the shape of the superluminescent diode emission spectrum was changed to a two-peak form, whilst making it wider at the same time. The example shows that the invention allows a significant influence on the shape of superluminescent diode emission spectrum. FIG. 10 presents the shape of superluminescent diode emission spectrum obtained according to the second embodiment of the present invention. Applying a substrate with wide, approximately flat areas allowed obtaining an increased intensity of light generation for chosen wavelengths, which allowed widening of the superluminescent diode emission spectrum.

Example 3

The third embodiment of the present invention is a superluminescent diode with a widened emission spectrum and a linear variation of the misorientation angle in the y direction, described by the equation W6, created on a uniform $GaO_xN_{1-x}$ substrate obtained in high-pressure growth. In the first step a $GaO_{0.0005}N_{0.9995}$ substrate was created by means of growing from a gallium solution of nitrogen under the pressure of 1000 MPa and at temperature of 1500° C. The obtained crystal was cut and polished so as to obtain a parallel-flat plate with typical thickness of 250 µm. After appropriate mechano-chemical polishing, the crystal surface with gallium polarity had an atomic smoothness, demonstrated by the atomic steps in an Atomic Force Microscope image. The crystal surface was disoriented by 0.2° in relation to the direction of the crystallographic axis c of the GaN hexagonal (wurtzite) structure.

Next, a 3 µm thick positive photoresist 1 layer was deposited on the substrate 4. The layer was irradiated by means of a laser writer apparatus with a 405 nm wavelength emission laser as the light source. The irradiation was performed by scanning the photoresist 1 surface by a light beam, wherein the light intensity was changing according to the design of the substrate 4 forming. This example uses the irradiation pattern enabling to create on the substrate 4, in the region of one superluminescent diode, a misorientation angle θ in the y direction described by the equation W6:

$$\theta = \left(\frac{a_1}{\exp\left(\frac{y-ld_1}{b_1}\right)} + \frac{a_2}{\exp\left(\frac{y-ld_2}{b_2}\right)}\right)\left(\frac{\theta_{min} - \theta_{max}}{a_1 + a_2}\right) + \theta_{max}, \quad (W6)$$

where $\theta_{max}$ is the maximum misorientation angle in the direction perpendicular to the y direction equal to arctg(h/ w), $\theta_{min}$ is the minimum misorientation angle in the direction perpendicular to the y direction, $a_1$ and $a_2$ are parameters affecting the relative heights of the first and second level, $b_1$ and $b_2$ are parameters affecting the profile shape of the first and second level, $d_1$ and $d_2$ are parameters affecting the location of the first and second level in the y direction. In this embodiment, the shape of the substrate surface can be described by the equation:

$$z = xtg\left(\left(\frac{a_1}{\exp\left(\frac{y-ld_1}{b_1}\right)} + \frac{a_2}{\exp\left(\frac{y-ld_2}{b_2}\right)}\right)\left(\frac{\theta_{min} - \theta_{max}}{a_1 + a_2}\right) + \theta_{max}\right) \quad (W7)$$

In the presented embodiment, the following parameters were applied: h=3.6 μm; w=150 μm; l=1300 μm; $\theta_{max}$=1.4; $\theta_{min}$=0.2; $a_1$=1; $a_2$=1.5; $b_1$=0.3; $b_2$=0.35; $d_1$=0.36; and $d_2$=0.58.

Substrate 4 with formed photoresist 1 was subjected to the reactive ions dry etching method using argon-chlorine plasma. The etching time was 17.5 minutes. The process allowed the photoresist 1 structure to be transferred to the gallium nitride bulk substrate 4. The obtained plane, with two smoothed levels, is shown in FIG. 11, having a varying misorientation angle in the y direction, shown in FIG. 12. Next, the substrate 4 was placed in a MOVPE reactor, where 800 nm thick $Ga_{0.92}Al_{0.08}N$ layer 5, doped with silicon to the $5\times10^{18}$ $cm^{-3}$ level, was created, at the temperature of about 1050° C. Then, at the same temperature, a 100 nm thick layer of undoped GaN was created, acting as the lower waveguide 6. After lowering the temperature to 820° C. a light emitting region 7 was created, as an $In_{0.1}Ga_{0.9}N/In_{0.02}Ga_{0.98}N$ multiple quantum well, where the number of quantum wells was three. Then, after increasing the reactor temperature to 1050° C. a $Al_{0.2}Ga_{0.98}N$:Mg layer 8 was created, for blocking the escape of the electrons. Afterwards, an undoped GaN layer was created, acting as the upper light guide 9. The next layer was the 430 nm thick $Al_{0.05}Ga_{0.95}N$ upper cladding layer 10. The structure's growth was finished by a thin GaN:Mg subcontact layer 11 with magnesium concentration higher than $10^{20}$ $cm^{-3}$. After completion of the structure growth the reactor was cooled in nitrogen atmosphere.

Next, photolithography defining the mesa shape as a curved strip was performed (FIG. 5b). The ending curvature of the light guide 14 in relation to the crystal cleavage planes (the future exit windows of the light guide 15) was 6°.

The process of creating the mesa and the upper contact, as well as division of the crystal on strips and the assembly of the chips, was carried in a way analogical to that described in the example 1.

Due to applying the substrate described by equation W7, the shape of the superluminescent diode emission spectrum was changed to an approximately rectangular form. In this embodiment, the misorientation profile in y direction had a shape of two smoothed levels, wherein their heights can be different. The wide, approximately flat areas cause an increased light generation for the chosen wavelengths. As a result, in this embodiment, the superluminescent diode emission spectrum exhibits an approximately rectangular shape and is significantly wider in relation to the classical devices, which is shown in FIG. 13. The example shows, that the invention allows a substantial influence on the shape of the superluminescent diode emission spectrum.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

The invention claimed is:

1. An AlInGaN alloy based superluminescent diode, comprising:
   a gallium nitride bulk substrate having a spatially varying surface misorientation;
   a lower cladding layer with n-type electrical conductivity;
   a lower light-guiding layer with n-type electrical conductivity;
   a light emitting layer;
   an electron blocking layer with p-type electrical conductivity;
   an upper light-guiding layer;
   an upper cladding layer with p-type electrical conductivity; and
   a subcontact layer with p-type electrical conductivity;
   wherein the gallium nitride bulk substrate has a spatially varying surface misorientation, increasing from a back light guide window towards a front light guide window, in a direction perpendicular to a crystallographic plane M in range of 0° to 10°, where the misorientation change is continuous and linear, approximately linear, or non-linear in relation to a light guide axis.

2. The superluminescent diode according to claim 1, wherein the substrate misorientation, expressed by an angle θ in relation to a direction parallel to a crystallographic plane C and perpendicular to the crystallographic plane M, has an approximately linear character satisfying the relation:

$$\theta = \arctg\left(\frac{h}{wl}y\right),$$

wherein y is a coordinate in the direction parallel to the crystallographic plane C and perpendicular to the crystallographic plane M, w is a parameter specifying a chip width of the manufactured superluminescent diode, l is a parameter specifying a chip length of the manufactured superluminescent diode, whereas h is a maximum depth at which the substrate is formed.

3. The superluminescent diode according to claim 1, wherein the substrate misorientation, expressed by an angle θ in relation to a direction parallel to a crystallographic plane C and perpendicular to the crystallographic plane M, has a non-linear character satisfying the relation:

$$\theta = \frac{\theta_{min} - \theta_{max}}{\exp\left(\frac{y-l}{b}\right)+1} + \theta_{max},$$

wherein y is a coordinate in the direction parallel to the crystallographic plane C and perpendicular to the crystallographic plane M, $\theta_{max}$ is a maximum misorientation angle in the direction perpendicular to y direction, $\theta_{min}$ is a minimum misorientation angle in the direction perpendicular to the y direction, b is a parameter affecting a profile shape, l is a parameter specifying a chip length of the manufactured superluminescent diode.

4. The superluminescent diode according to claim 1, wherein the substrate misorientation, expressed by an angle θ in relation to the direction parallel to a crystallographic plane C and perpendicular to the crystallographic plane M, has a non-linear character satisfying the relation:

$$\theta = \left(\frac{a_1}{\exp\left(\frac{y-ld_1}{b_1}\right)} + \frac{a_2}{\exp\left(\frac{y-ld_2}{b_2}\right)}\right)\left(\frac{\theta_{min}-\theta_{max}}{a_1+a_2}\right)+\theta_{max},$$

wherein y is a coordinate in the direction parallel to the crystallographic plane C and perpendicular to the crystallographic plane M, $\theta_{max}$ is a maximum misorientation angle in the direction perpendicular to y direction, $\theta_{min}$ is a minimum misorientation angle in the direction perpendicular to the y direction, $a_1$ and $a_2$ are parameters affecting a relative heights of a first and a second level, $b_1$ and $b_2$ are parameters affecting a profile shape of the first and second level, $d_1$ and $d_2$ are parameters affecting a location of the first and the second level, l is a parameter specifying a chip length of the manufactured superluminescent diode.

5. The superluminescent diode according to claim 1, wherein a front light guide window is covered with a dielectric layer having a reflectivity coefficient lower than 5%.

6. The superluminescent diode according to claim 1, wherein a back light guide window is covered with a dielectric layer having a reflectivity coefficient higher than 80%.

7. The superluminescent diode according to claim 1, wherein the subcontact layer is doped with acceptors above a concentration of $10^{20}$ cm$^{-3}$.

* * * * *